United States Patent [19]

Inoue et al.

[11] 4,052,211
[45] Oct. 4, 1977

[54] IMAGE FORMING MATERIAL

[75] Inventors: Eiichi Inoue; Hiroshi Kokado, both of Tokyo; Takashi Yamaguchi, Yokohama; Yukio Tokunaga, Musashino; Takao Nakayama, Yokohama; Toshihiro Yamase, Tokyo, all of Japan

[73] Assignee: Fuji Photo Film Co., Ltd., Minami-ashigara, Japan

[21] Appl. No.: 644,010

[22] Filed: Dec. 24, 1975

Related U.S. Application Data

[63] Continuation-in-part of Ser. No. 420,347, Nov. 29, 1973, abandoned.

[30] Foreign Application Priority Data

Nov. 30, 1972 Japan .................. 47-120466

[51] Int. Cl.$^2$ .............. G03C 5/00; G03C 1/84; G03C 1/02
[52] U.S. Cl. .......................... 96/35; 96/36; 96/36.2; 96/84 M; 96/120
[58] Field of Search ............ 96/67, 88, 36, 48, 84 M, 96/86 R, 35, 36.2, 114.1

[56] References Cited

U.S. PATENT DOCUMENTS

| | | | |
|---|---|---|---|
| 3,615,431 | 10/1971 | Gilman | 96/48 PD |
| 3,647,439 | 3/1972 | Bass | 96/48 PD |
| 3,649,272 | 3/1972 | Gilman | 96/88 |
| 3,674,485 | 7/1972 | Jonker et al. | 96/35 |
| 3,690,886 | 9/1972 | Van Den Heuvel | 96/48 PD |
| 3,718,467 | 2/1973 | Inoue et al. | 96/88 |

FOREIGN PATENT DOCUMENTS 1,151,310  5/1969  United Kingdom ............ 96/48 PD

*Primary Examiner*—David Klein
*Assistant Examiner*—A. T. Suro Pico
*Attorney, Agent, or Firm*—Sughrue, Rothwell, Mion, Zinn and Macpeak

[57] ABSTRACT

A multilayer image-forming material which comprises an organic sulfur compound and a metal capable of interreacting upon irradiation with electromagnetic radiation to form an interreaction product or products (hereinafter product and products will simply termed "product"). When the image-forming material is imagewise irradiated with electromagnetic radiation, an interreaction product of the organic sulfur compound and the metal is formed in the irradiated portions of the material, and the physical, chemical and pysico-chemical properties of the thus formed interreaction product are different from those of the respective organic sulfur compound and metal in the non-irradiated portions. Utilizing this difference in properties, the present image-forming material is useful for various applications.

16 Claims, 13 Drawing Figures

IMAGE FORMING MATERIAL

CROSS-REFERENECE TO RELATED APPLICATIONS

The present application is a continuation-in-part of Ser. No. 420,347 filed Nov. 29, 1973 now abandoned.

BACKGROUND OF THE INVENTION

1. Field of the Invention

This invention relates to an image-forming material of a multilayer configuration which comprises an organic sulfur compound and a metal capable of interreacting therewith upon irradiation with electromagnetic radiation to form an interreaction product. In the present image-forming material, in general, mere irradiation with electromagnetic radiation causes the formation of an image, and thus, this material can be utilized for the formation of an electric resistance pattern and a metal relief as well as for printed circuits, etching resists, masters for electrostatic printing and lithographic printing plates.

2. Description of the Prior Art

Various methods and materials for forming metal patterns have heretofore been proposed. One of them is an etching method using a photo-resist, which has been known in the past. Recently, other various methods and materials have been developed, including a multilayer material consisting of a chalcogen compound and a metal, a multilayer material consisting of an polyhalogenated organic compound and a metal, and a material to be etched in a solution of photo-etching compound or in steam.

SUMMARY OF THE INVENTION

This invention is based on a discovery of novel characteristics of organic sulfur compounds and metals and one object of this invention is to provide novel image-forming materials utilizing these novel characteristics of organic sulfur compounds and metals.

Therefore, this invention provides a novel multilayer image-forming material comprising an organic sulfur compound and a metal. In the present image-forming material, an interreaction product is formed in the portions thereof which have been irradiated with electromagnetic radiation, whereby an image can be formed due to the difference between the physical, chemical and physico-chemical properties of the interreaction product formed and the properties of the other non-irradiated portion. Further, by utilizing the differenceof properties between these portions, the materials of the present invention can be used in various applications.

DETAILED DESCRIPTION OF THE INVENTION

Now, the present invention will be explained in more detail with reference to the accompanying drawings.

Figure 1:
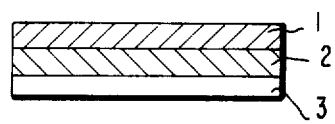
FIG. 1 and FIG. 2 are sectional views each showing one embodiment of an image-forming material of the present invention.
Figure 2:
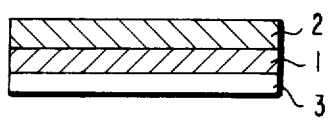

FIG. 1 and FIG. 2 show typical multi-layer configurations of image-forming materials of this invention, where 1 is an organic sulfur compound layer, 2 is a metal layer, and 3 is a substrate. With reference to FIG. 1, the metal layer 2 is first applied in an amount of, for example, 0.1 $\mu$ to 5$\mu$, preferably 0.3 $\mu$ to 9$\mu$, on the surface of the substrate 3 and the organic sulfur compound layer 1 is then superposed on this metal layer in an amount of, for example, 0.1$\mu$ to 5$\mu$, preferably 0.3$\mu$ to 1$\mu$. In the material of FIG. 2, the organic sulfur compound layer 1 is first applied on the surface of the substrate 3 and the metal layer 2 is then superposed on this layer 1. In the irradiation with electromagnetic radiation of this material, the irradiation can be either from the multilayer side or from the rear side of the substrate. In the former case, the uppermost organic sulfur compound layer 1 or metal layer 2 must be of an appropriate thickness so that a sufficient amount of electromagnetic radiation can be transmitted to form an interreaction product of these two layers. In particular, when the metal layer 2 is used as the uppermost layer, special attention must be paid to the thickness of this layer. In the latter case, it is preferred that the substrate be transparent to electromagentic radiation used in the irradiation, and further, this substrate must have an appropriate thickness so that a sufficient amount of electromagnetic radiation can be transmitted to produce an interreaction product of the organic sulfur compound layer 1 and the metal layer 2 which are applied on the surface of the substrate 3. In particular, when the metal layer 2 is put directly on the surface of substrate 3, special attention must be paid to the thickness of this layer 2. Anyhow, in order to produce an interreaction product from the organic sulfur compound layer 1 and the metal layer 2 by irradiation with electromagnetic radiation thereto, it is necessary that the electromagnetic radiation reach at least the interfacial area between the organic sulfur compound layer 1 and the metal layer 2, and in addition, the electromagnetic radiation must have sufficient energy, about $10^2$ to $10^9$ erg/cm$^2$, preferably $10^3$ to $10^8$ erg/cm$^2$, for producing the interreaction product. Appropriate thicknesses are described above.

Organic sulfur compounds can be roughly classified into:

A. dithiocarbamate types having the general formula

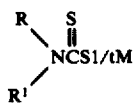

wherein R and $R^1$ each is a hydrogen atom, an alkyl ($C_nH_{2n+1}$ $n$:1-6, preferably 1-4) group, or an aryl group, and R and $R^1$ may combine to form a 5- or 6-membered staturated ring such as a piperazine ring, a morpholine ring, a piperdine ring, a pyrrolidine ring, an imidazoldine ring, pyrazolidine ring, and the like, and M is a hydrogen atom, a metal ion or group such as potassium, sodium, ammonium, copper, silver, gold, tin, zinc, iron, selenium, tellurium, and the like;

B. trithiocarbonate types, having the general formula

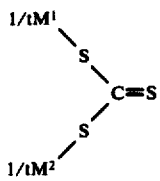

wherein $M^1$ and $M^2$ each is a hydrogen atom, a metal ion or group such as silver, gold, potassium, sodium, ammonium, copper (I), thallium, or a divalent metal such as calcium, copper (II), iron zinc, barium, strontium, titanium, tellurium, arsenic, selenium, etc.;

C. dithiophosphate types, having the general formula

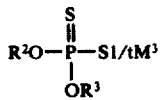

wherein $R^2$ and $R^3$ each is a hydrogen atom, an alkyl ($C_nH_{2n+1}$ $n$:1-8) group or an aryl group, wherein $M^3$ is a hydrogen atom, a metal ion or group such as silver, gold, potassium, sodium, ammonium, copper (I), thallium, calcium, copper (II) iron, zinc, $UO_2$, barium, strontium, titanium, tellurium, and the like;

D. dithioxanthate types, having the general formula

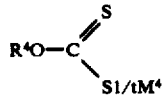

wherein $R^4$ is an alkyl group ($C_nH_{2n+1}$ $n$:2-5) and $M^4$ is a hydrogen atom, a metal ion or group such as silver, gold, potassium, sodium, ammonium, copper, calcium, barium, and the like; and E. other type compounds, including bismuthion-II (5-mercapto-3-phenyl-1,3,4-thiadiazoline-2-thione(-potassium salt) (CAS Registry Number 17654-88-5)),.

In the above formulas, $t$ represents the valency of the metal ion or group.

The dithiocarbamate-type compounds (A) include dithiocarbamate-metal complexes, n-butylmethyl-dithiocarbamate, 2,4-dinitrophenylhexamethylene-dithiocarbamate, etc. The trithiocarbonate-type compounds (B) include n-butylethyltrithiocarbonate, 2,4,-dinitrophenylethyltrithiocarbonate as well as the salts of ethyltrithiocarbonate with copper, arsenic, selenium, uranium oxide or tellurium, ect. The dithiophosphate compounds (C) include copper dimethyldithiophosphate, selenium dimethyldithiophosphate, ethyldimethyldithiophosphate, and the like.

As for the metal layer 2, typical metals therefor are, for example, silver, aluminum, copper, gold, magnesium, nickel, tin, tellurium, gallium and cadmium, in decreasing order of preference.

The substrate 3 can by any one which possesses appropriate structural rigidity, and is in general, a glass, a resin film, a metal plate, and the like.

The formation of the metal layer 2 can be carried out using a vacuum plating method, a sputtering method, a chemical plating method, a metal foil lamination method, etc.

The formation of the organic sulfur compound layer 1 can be formed by using a vacuum plating method, a sputtering method, a coating method, etc. In the coating method, the organic sulfur compound can be dissolved or dispersed in a solvent generally in a concentration lower than 30% by weight and then applied to the substrate. Appropriate solvents which can be used are water, methanol, ethanol, chloroform, carbon disulfide and the like for the dithiocarbamate-type compounds, water, ethanol and the like for the trithiocarbonate type compounds, water for the dithiophosphate type compounds, water, ethanol, acetone and the like for the dithioxanthate type compounds. In addition, these compounds can be dispersed or dissolved in an appropriate binder in an amount of greater than or equal a weight ratio of 0.5 of the organic sulfur compound to the binder and then applied to substrate for forming thereon a layer of the compound.

Suitable water-soluble binders are gelatin, polyvinylalcohol, polyvinylpyrrolidone, polyethyleneoxide, carboxymethylcellulose, gum arabic, hydroxyethylcellulose, partially hydrolized ethylenevinylacetate copolymer, ethylene-acrylic acid copolymer and the like.

Suitable oil-soluble binders are polyvinylacetal, polyvinylbutyral, phenol resins polyvinylchloride, polyvinylformal, polyvinylacetate, polystyrene, polyvinylidenechloride, polybutylmethacrylate, and the like.

When the thus prepared image-forming material, for example, having the configuration as shown in FIG. 1 or FIG. 2, is irradiated with electromagnetic radiation via an mask pattern 4, the electromagnetic radiation is transmitted or absorbed according to the light and dark portions of the mask pattern 4, whereby the irradiated portions and non-irradiated portions are differently formed on the thus treated image-forming material. The non-irradiated portion of the material is not changed at all, remaining as such; while in the irradiated portion thereof an interreaction product 5 of the organic sulfur compound layer 1 and the metal layer 2 is formed. The thus formed interreaction product layer 5 can be differentiated from the remaining non-irradiated layer portion fromthe standpoint of the physical, chemical and physico-chemical properties, and thus it is possible to distinguish the irradiated portion and the other non-irradiated portion, and in addition, the image-forming material of this invention can be employed in various industrial applications by utilizing this difference in properties.

Figure 6:
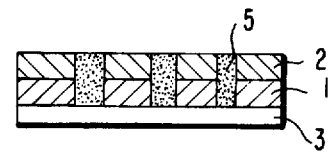
FIG. 5 and FIG. 6 are sectional views each showing one embodiment of the formation of the interreaction product after irradiation with electromagnetic radiation, through a pattern, of the image-forming material of the present invention corresponding to each of FIGS. 1 and 2.
Figure 5:
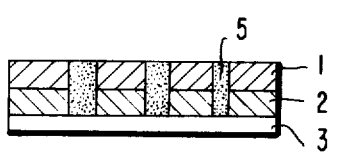

With reference to FIGS. 5 and 6, explanation will be given hereunder on the differences (or changes) in these properties. The first difference which can be noticed is that there is a change in the optical properties of the formed interreaction product. More precisely, the interreaction product layer 5 formed by irradiation has an increased optical transmittance and decreased optical reflectance, as compared with metal layer 2. On observation of the image-forming material having an irradiated portion and non-irradiated portion using transmitted light, therefore, the non-irradiated portion appears dark since the light is absorbed by the metal layer 2 and the interreaction product layer 5 appears light since it is able to transmit a large amount of light. In this case, the contrast between these two portions of course differently varies, depending upon the thickness of the metal layer 2. Next, on observation of the material using reflected light, the non-irradiated portion shows a metallic gloss due to the metal layer 2 but the interreaction product layer 5 appears dark, since it has less optical reflectance than the metal layer 5, whereby an image of distinct contrast is obtained. These differences in optical properties can also be detected instrumentally as well as visually, and further can also be detected by holographic means. In addition, the so-called color sensitization becomes possible by contacting the organic sulfur compound layer with a triphenylmethane type dye such as Bromo Phenol Red, Tetra Bromo Phenol Blue, Fuchsine, Malachite Green, Crystal Violet Basic Dye (C.I. 42037), Para Magenta (C.I. 42500), C.I. Basic Blue 26 (C.I. 44045), etc., Michler's ketone such as tetramethylaminobenzophenone, dimethoxybenxophenone, thiobenzophenone, dimethoxythiobenzophenone, and the like, a xanthene dye such as Acid Red 45 (C.I. 45,386), Acid Red 51 (C.I. 45,430), Rhodamine B, Rhodamine 6 GCP, Fluorescein and the like, etc. These sensitizers can be used in an amount of from about 0.001 to 0.3, preferably 0.005 to 0.2 percent of a molar basis, to the amount of the organic sulfur compound.

The second difference which can be noticed between the properties of the irradiated portion and non-irradiated portion is the difference in the solubilities of these two portions. Depending upon the qualities of layers constituting the image-forming material, the solvent therefor must be appropriately selected, and some solvents can dissolve some of the layers, but will not dissolve the other layers.

Figure 7:
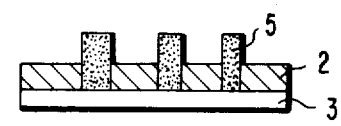
FIGS. 7 through 11 are sectional views each showing one embodiment after dissolution of the respective layer(s) by utilizing the difference in solubilities of the respective layers which occurred after irradiation with electromagnetic radiation.
Figure 3:
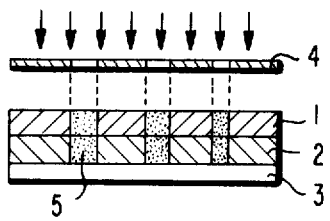
FIG. 3 and FIG. 4 are sectional views each showing one embodiment after irradiation with electromagnetic radiation, through a mask, of the image-forming material of the present invention corresponding to each of FIGS. 1 and 2.

For example, when a method for dissolving the organic sulfur compound layer 1 is applied to the irradiated image-forming material of FIG. 5, only the metal layer 2 and the interreaction product layer 5 remain on the substrate 3, as shown in FIG. 7. More precisely, when a carbamate complex is used as the organic sulfur compound and $CHCl_3$ or $CCl_4$ is applied as a solvent, the carbamate complex is dissolved and removed while the other interreaction product layer 5 and the metal layer 2 are not dissolved and remain as such. On the other hand, when bismuthiol-II is used as the organic sulfur compound, this can be dissolved and removed with an alcohol (e.g., methanol, ethanol, propanol, isopropanol, butanol, and the like) or water and the interreaction product layer 5 is not dissolved and remains as such, whereby the resulting material has a constitution as shown in FIG. 7. The material having the configuration of FIG. 7 does not have any light-sensitivity, but the contrast of the resulting image is similar to that shown in the above described FIG. 5. Thus, this dissolution step in a sense is a fixation step of the image-forming material of the present invention.

In the irradiated image-forming material as shown in FIG. 6, the metal layer 2 can be removed. For example, when silver is used as the metal layer 2, mercury can be reacted therewith to form silver amalgam which can be thereafter removed. In general, the metal layer 2 can be dissolved with an acid, and the thus treated material has the configuration as shown in FIG. 8.

Figure 8:
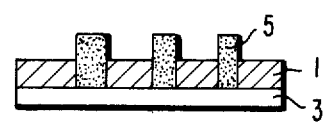
Figure 4:
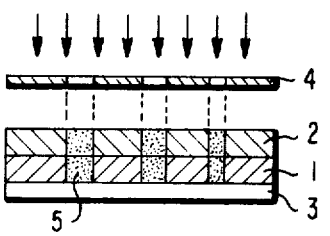
Figure 9:
Figure 10:
Figure 11:
Figure 16:
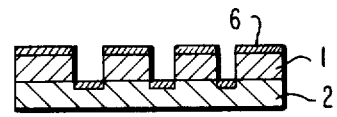
FIG. 15 through 17 are sectional views showing one embodiment of steps for rendering the material oleophilic in the production of lithographic printing plate using the image-forming material of this invention.

In addition, it is further possible, if necessary, to remove any one of the metal layer 2, the organic sulfur compound layer 1 and the interreaction product layer 5 from the material as shown in FIG. 7 and 8, thereby to obtain image patterns having configurations such as are shown in FIGS. 9 and 11. More precisely, after removal of the metal layer 2 or the organic sulfur compound layer 1 from the configuration shown in FIG. 7 or FIG. 8, a pattern is obtained where only the interreaction product layer 5 remains (FIG. 9). This removal may be carried out in a manner similar to the above-described procedure. On the other hand, when the interreaction product layer 5 is removed from the configuration shown in FIG. 7 or FIG. 8, a pattern can be obtained where only the metal layer 2 or the organic sulfur compound layer 1 remains, as is shown in FIG. 10 or FIG. 11 respectively.

The electric resistance of the interreaction product layer 5 is different from that of the metal layer 2 and the organic sulfur compound layer 1. That is, the respective electric resistance of these three layers increase in the order of the metal layer 2, the organic sulfur compound layer 1 and the interreaction product layer 5. The interreaction product layer 5 can be have different electric resistance values, depending upon the amount or energy level of the irradiated electromagnetic radiation even though this layer 5 is derived from the combination of the same metal and the same organic sulfur compound. Accordingly, in the material as shown in FIG. 5, the surface thereof after irradiation through a mask pattern consists of the organic sulfur compound layer 1 and the interreaction product layer 5, and a pattern of different electric resistance values between these layers 1 and 5 is formed. In the material as shown in FIG. 6, the surface thereof consists of the metal layer 2 and the interreaction product layer 5, and a pattern of different electric resistance values between these layers 2 and 5 is formed. In any one of the materials as shown in FIGS. 7 through 11 where a part of the layers has been dissolved out by utilizing the difference in solubilities between the respective layers, a pattern of different electric resistance values between these layers is formed.

In the organic sulfur compound layer 1, the metal layer 2 and the interreaction product layer 5, the respective adsorbability e.g., to dyes, solvents or other chemicals of these layers differs from each other. In addition, the wettability of the surface of each of these layers also is different from each other.

As described above, among the interreaction product layer 5 formed after irradiation with electromagnetic radiation of the image-forming material of this invention and the organic sulfur compound layer 1 and metal layer 2 which constitute the elements of the present image-forming material, differences remarkably appear in the physical, chemical and physico-chemical properties of these layers, and by utilizing this change in characteristics of the respective layers, the image-forming materials of this invention can be utilized in many useful applications.

Now, a detailed explanation will be given hereunder on the uses of the image-forming materials of this invention. It is natural that the present image-forming material can be used as an image recording material by utilizing the different optical characteristics of the layers. In this connection, it has been confirmed that the resolving power of the present material is 1000 lines/mm or more in the experiment for preparing holograms in the silver-bismuthiol system. Thus, the present material is a recording material of extremely high resolving power. With respect to the sensitivity of the material, the sensitivity can vary, depending on the combination of organic sulfur compound used and metal used, and, for example, in the combination of bismuthiol-II, Rose Bengal or erythrosine B and silver, aluminum or copper, image forming is possible by exposure to a mercury-vapor lamp of 10 mW/cm$^2$ for 1 minute or less and the resulting image is sufficient from a practical standpoint. For fixation of the resulting image, either organic sulfur compound layer 1 or metal layer 2 or both of them is (are) removed by utilizing the difference in solubilities between the organic sulfur compound layer 1 and the metal layer 2 and the interreaction product layer 5 so as to fix the non-irradiated portion, as described above, and after this treatment, the resulting material is stable on storage for a long period of time. In particular, when the metal layer 2 remains as shown in FIG. 7 and FIG. 10, sufficient image contrast can be obtained and the result obtained is quite excellent. On the other hand, when elements of somewhat low sensitivity are used, only exposure need be carried out without fixation and the resulting material can be stored in normal room illumination for a relatively long period of time. In this case, the material can be used as a non-treated image forming material. When the present material is applied to the above-described use, this can be used in place of light-sensitive materials which have now been mainly used, and additional explanations will be unnecessary on the utilization thereof, since such is quite self-explanatory to those skilled in the art.

Fixation is possible by utilizing the difference in solubilities between the organic suflur compound layer 1, the metal layer 2 and the interreaction product layer 5, which was already described in the above, and by utilizing this difference in solubility, the material of the present invention can be applied to various uses such as the formation of printed circuits, printed resistance and metal reliefs as well as anti-corrosive resists.

When the present material is utilized for printed circuits, it is preferable to employ an image-forming material of the configuration such as is shown in FIG. 1, although the material is of course not limited to this. When the material is first irradiated with electromagnetic radiation via a mask pattern of the circuit desired to be printed, the layer corresponding to the writing circuit is not irradiated and remains as such while the metal layer 2 in other parts disappears due to the irradiation to form the interreaction product layer 5, and consequently the thus irradiated material becomes the configuration of FIG. 5. To this applied an appropriate solvent to dissolve the organic sulfur compound layer 1, whereby the configuration of the resulting material becomes that of FIG. 7. The resulting material can be used as such (without further treatment) as a printed circuit plate, or otherwise, the interreaction product layer 5 thereof can further be dissolved out to form a configuration of metal pattern only such as is shown in FIG. 10, and the complete metal pattern plate can be used as a printed circuit plate. In addition, electric plating can further be applied to the configuration of FIG. 7 to supplement the printed lead portion thereof. In this electric plating, the interreaction product layer 5 can effectively serve to prevent the occurrence of bridging between the printed leads by plating, even though the interval between the leads is extremely small. Substrate 3 to be used for this object can be materials such as Bakelite plates, glass-epoxy plates or the like, and as the metal layer 2 silver or copper is preferred. The silver or copper can be applied to the substrate 3 by vacuum plating or chemical plating, or otherwise a foil of the metal can be laminated to the substrate, Thereafter, the organic sulfur compound layer 5 is superposed on the metal layer to prepare the image-forming material.

In the formation of a printed resistance from the present material, phenomena are utilized such that the configuration of the interreaction product layer 5 formed after the irradiation with electomagnetic radiation of the image-forming material of this invention is in a pattern-like form and that the electric resistance of this pattern-like layer 5 can appropriately be controlled within a certain range. Thus, this pattern-like layer 5 is used as an electric resistance element for an electric circuit. In this printed resistance, the necessary resistance elements can optionally be formed in the required positions in accordance with the planning of the electric circuit, by irradiation with electromagnetic radiation of the image-forming material. This kind of printed resistance has a configuration such as is shown in FIG. 7 or FIG. 9, which can be formed according to methods already described. Further, the printed resistance element can also be formed simultaneously with the formation of a printed circuit according to these methods.

Figure 12:
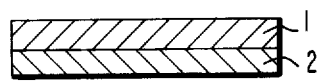
FIG. 12 is a sectional view showing one embodiment of an image-forming material for producing a metal relief.
Figure 17:
Figure 13:
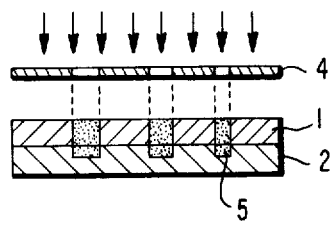
FIG. 13 is a sectional view showing one embodiment of irradiation with electromagnetic radiation of the image-forming material having the configuration of FIG. 12.
Figure 14:
FIG. 14 is a sectional view of the metal relief obtained.
Figure 15:

For formation of a metal relief, an image-forming material as shown in FIG. 12 can be used. More precisely, on the metal plate 2, from which a relief is to be formed, an organic sulfur compound layer 1 is applied, and the resulting laminate is irradiated with electromagnetic radiation via an appropriate mask pattern, as shown in FIG. 13, whereby the interreaction product layer 5 is formed in the irradiated portion of the laminate from the organic sulfur compound layer 5 and the corresponding portion of the metal plate 2 below the surface thereof. In the thus irradiated laminate, the organic sulfur compound layer 1 and interreaction product layer 5 are dissolved out according to methods as described above, thereby to obtain a metal relief plate as shown in FIG. 14. The resulting metal relief plate can be used as a relief printing plate. In its use as a relief printing plate, a copper plate is generally used as the metal plate 2. On the other hand, the height of the relief is appropriately controlled to form a slight intaglio part, wherein copper is plated using chemical plating or a plate lacquer or developing ink is applied thereby to obtain a lithographic plate. In the formation of this lithographic plate, an aluminum plate is used as metal plate 2, and after irradiation, the interreaction product layer 5 is first dissolved out to retain the organic sulfur compound layer 1, as shown in FIG. 15, and thereafter, a treatment for rendering the resulting constitution of FIG. 15 olephilic to form an oleophilic layer 6, and then the organic sulfur compound layer 1 is dissolved out to retain the oleophilic layer 6 which serves as a oleophilic resistant film, whereby a lithographic plate as shown in FIG. 17 can be obtained.

When used as an etching resist, the material is treated to form a configuration such as is shown in each of FIG. 9 through FIG. 11, and the interreaction product layer 5, the metal layer 2 or the organic sulfur compound layer 1 in the thus treated material is used as a resist. Of course, the combination must be so selected that these layers are not etched by an etching solution. The metal layer 2 of FIG. 10 is especially effective as a resist. In this case, it is natural that a material which can be etched is used as the substrate 3.

As already described in the above explanation, the interreaction product layer 5, metal layer 2 and organic sulfur compound layer 1 have individually different electric resistance values, and one of the uses of the image-forming material of the present invention is to prepare a printed resistance therefrom. As another use of this kind of resistance pattern, the pattern can also be utilized as a master for electrostatic printing. This method is based on electrophotographic techniques and utilizes such phenomena that, when resistance pattern is subjected to a charging treatment, the electric charge imparted is maintained in the high resistance portion while the electric charge is dissipated and lost in the other portion of low resitance with the result that the resistance pattern is consequently converted to charged pattern after the completion of this charging step.

Figure 18:
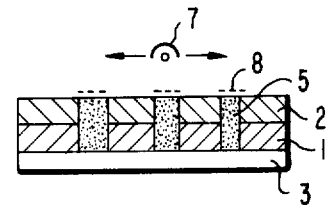
FIG. 18 is a sectional view showing one embodiment of the charging step in the conversion of a resistance pattern obtained to a charged pattern.

For example, after irradiation with electromagnetic radiation via an appropriate mask pattern, the surface of the irradiated material consists of the metal layer 2 and the interreaction product layer 5, as shown in FIG. 6, and in these layers 2 and 5, the metal layer 2 cannot retain an electric charge while the other interreaction product layer 5 can retain the same. Therefore, it is possible to form a charged pattern from this material. FIG. 18 shows one embodiment of the formation of this charged pattern, where 7 is a charging device and 8 is the electric charge maintained.

After formation of the charged pattern as described above, this pattern can be developed with a developer such as colored powdered developer charged in the opposite polarity, e.g., a commercially available toner for xerographic use or electrofax use, thereby to form an image of the colored powder, and the resulting image can be fixed as such or can be first transferred to another support according to any optional method and then is fixed, e.g., by fusing the toner using heating or solvent vapor techniques, thereby to obtain a visible image. In such a case, the material is not limited at all to one having the above-described configuration, and it is apparent that almost all configurations already explained in detail in the above can be utilized therefor.

By utilizing the difference in adsorbabilities of the respective layers after the irradiation with electromagnetic radiation and by coloring a portion of the layers with dyes, and the like, images of excellent contrast can be obtained. For example, where the metal employed is silver, image contrast can be enhanced using toning techniques which are conventional and well known in the filed of chemical photography, and to enhance the density of silver image portions physical development can also be employed. If a dyeing of the interreaction product layer is desired, the appropriate techniques mainly depend on the binder used in the layer, for example, when a hydrophilic binder is used a direct dye can be suitably employed and when an oil-soluble binder is used, a dispersion dye is suitable for use.

In addition, by utilizing the difference in wetabilities between the irradiated portion and non-irradiated portion, a non-treated lighographic plate can also be obtained. For example, in the configuration as shown in FIG. 6, when aluminum is used as the metal layer 2, the aluminum layer remains in the non-irradiated portion, which can be rendered hydrophilic by applying gum arabic or the like thereto, and further, after the surface of this material is rubbed with a plate lacquer or a developing ink, the interreaction product layer 5 is coated with the lacquer or ink. Thus, the hydrophilic part and the oleophilic part are formed in an image-wise manner, and the thus treated material can be used as a lithographic printing plate. In this case, exposure to electromagnetic radiation suffices for the formation of the plate without any additional treatment, such as development, and the resulting plate can be used quite well as a printing plate. In addition to this, after dissolution of some layer(s), the resulting material can also be utilized for forming a lithographic printing plate. For example, in the configuration of FIG. 9 through FIG. 11, the substrate 3 is first rendered hydrophilic, for example, using a graining procedure applied to the support (such as an aluminum plate) such as sand blasting, brushing with nylon brush, liquid honing and then the other interreaction product layer 5, the metal layer 2 or the organic sulfur compound layer 1 is treated to impart oleophilicity (ink receptive or ink accepting properties) thereto, whereby the resulting material can be used as a positive type lithographic printing plate.

As described above in detail, the image-forming material of this invention not only can be used per se as an image-forming material but also can be applied to other various uses over an extremely broad range, on the basis the phenomena in which when the present image-forming material is irradiated with electromagnetic radiation, the physical, chemical and physico-chemical properties of the irradiated portions thereof become markedly different from the properties of the other non-irradiated portions.

Now, the present invention will be explained in greater detail by reference to the following Examples. Unless otherwise indicated all parts, percents, ratios and the like are by weight.

EXAMPLE 1

A glass slide was plated with silver in a thickness of 150 Å using a vacuum plating method under a vacuum of $4 \times 10^{-5}$ Torr. A ULVAC Co. apparatus was used for plating a DRC Type vacuum evaporation rate controller produced by the SLOAN Co. was used as thickness controlling device. Next, a tungsten heating wire was wound around a Pyrex crucible of 1 cm in diameter, and 100 mg of dithiocarbamate-metal complex were put into this crucible. Then the silver plated specimen was positioned above the crucible at a height of 30 cm whereupon this specimen was plated with this complex under a vacuum of $4 \times 10^{-5}$ Torr. A plated film of the dithiocarbamate-metal complex having a thickness of about 2500 Å was formed. In the latter plating a plating apparatus produced by the Tokuda Manufacturing Co. was used. The thus prepared image-forming material was exposed to light using a 250 W ultra-high pressure mercury lamp produced by Ushio Co., via a pattern. In this exposure, a condensing lens having a focal length of 50 cm was positioned at a distance of 25 cm.

When a copper complex is used as the metal of the dithiocarbamate-metal complex, a tone change appeared after exposure for 10 minutes, and after exposure for 30 minutes, an image was obtained having sufficient contrast for observation using reflected light. Next, after the remaining complex was dissolved out with CHCl₃ for fixation, the irregular reflection on the exposed part became stronger and an image of far higher contrast was obtained. Afterwards, this was treated with mercury to dissolve the non-exposed silver, whereby an image of even higher contrast and sharpness was obtained.

EXAMPLE 2

In the various systems of the dimethyldithiocarbamate-metal complex and a metal, the respective image formability differently varies, depending upon the combination of the metal in the complex and the other metal layer employed. In the following Table, the relationship between the combination of metals and image formability thereof in various systems is shown. In this experiment, the image-forming metals used were prepared according to the same method as described in Example 1.

Table

| Metal in Complex | Metal | | | | | | | | | |
|---|---|---|---|---|---|---|---|---|---|---|
| | Cu | Ag | Sn | Ni | Cd | Mg | Te | Ga | Al | Au |
| Cu | O | O | | | | | | O | O | |
| Ag | O | O | | O | O | | O | O | O | O |
| Se | O | O | O | | O | | O | O | O | |
| Cd | O | O | O | | | O | O | O | O | |
| Fe | O | O | | O | | | O | O | O | O |
| Ni | O | O | O | | O | O | O | O | O | |
| UO₂ | | O | O | | | | O | O | O | |
| Sn$^{II}$ | | O | | | O | O | O | | O | |

In this Table, the combination designated by "O" yielded a good image.

EXAMPLE 3

A combination of diethyldithiocarbamate-copper complex and silver was used and the other procedures were the same as those of Example 1, whereby a good image was obtained therefrom.

In place of the metal complex of diethyldithiocarbamic acid, the metal complexes of dibutyldithiocarbamic acid, ethylphenyldithiocarbamic acid, methylphenyldithiocarbamic acid or butylmethyldithiocarbamic acid were used, and almost the same results were obtained in these cases.

EXAMPLE 4

On a microscope glass slide a silver plated film of about 200 A thickness was applied using vacuum plating under a vacuum of $4 \times 10^{-5}$ mmHg. Next, a solution of 20 mg of bismuthiol-II in 5 cc of ethanol was flowed and applied on this plated film, and after coating, the resulting film was dried at normal temperature (about 20°-30° C) in a dark place.

The thus prepared image-forming material was exposed to light using a 250 W ultra-high pressure mercury lamp via a pattern, with the distance between the material and the lamp being 25 cm (10 mW/cm²). After exposure for 30 seconds, an image was formed. After exposure for 30 seconds, the bismuthiol-II was dissolved out by washing with water for fixation thereby to obtain a good image.

EXAMPLE 5

A slide glass was plated with silver to form a plated film of 200 A thickness using vacuum plating, and then a solution of 10 mg bismuthiol-II in 5 cc of ethanol was applied on the plate and dried at normal temperature in a dark place, whereby an image-forming material was obtained.

The thus prepared material was used as a hologram recording material. Preparation of the hologram was carried out using two beams, the ratio of the optical strength of two luminous fluxes being 1.2. The offset angle of these two luminous fluxes was about 26°, and a bisectional line of this angle was vertical to the surface of the specimen.

The laser rays used were argon-ion laser rays having a bright line spectrum of 4880 A (54 Type by Coherent Radiation Co.), and the total optical strength thereof was 100 mW. The holograhic recording material was irradiated with these laser rays for 15 minutes from the bismuthiol-II side, and then one luminous flux was eliminated and primary diffraction ray from the other luminous flux was detected, whereupon a recording of 1000-1100 lines/mm was obtained.

EXAMPLE 6

A glass slide was plated with a dimethyldithiocarbamate metal complex in a thickness of 2400 A under a vacuum of $4 \times 10^{-5}$ Torr to prepare Recording Material No. I.

Another glass slide was plated with silver in a thickness of 50 A under a vacuum of $4 \times 10^{-5}$ Torr, and then dithiocarbamate metal complex layer of 2400 A thickness was further applied thereon to prepare Recording Material No. II.

Still another Recording Material No. III was prepared in a manner similar to Recording Material No. II with the exception that a silver plate of 100 A thickness was applied.

Each recording material thus prepared was exposed with gold electrodes (thickness: 300 A, interval: 0.1 mm) which were charged with voltage of 10 V under a vacuum of $1 \times 10^{-1}$ Torr, whereupon the electric current flowing in each material was as follows:

| | |
|---|---|
| Recording Material No. I | $10^{-12}$ ampere |
| Recording Material No. II | $10^{-10}$ ampere |
| Recording Material No. III | $10^{-8}$ ampere |

From the above results, it can be seen that when a multi-layer configuration of metal and organic sulfur compound is irradiated with light, an interreaction product of the metal and the sulphur compound is formed in the exposed portion.

While the invention has been described in detail and with reference to specific embodiments thereof, it will be apparent to one skilled in the art that various changes and modifications can be made therein without departing from the spirit and scope thereof.

What is claimed is:

1. A process for forming an image on a multilayer image-forming material which consists of imagewise irradiating with electromagnetic radiation a multilayer image-forming material which comprises a layer of an organic sulfur compound and a layer of a metal capable of forming an interreaction product with said sulfur compound upon said irradiation with electromagnetic radiation, said sulfur compound being selected from the group consisting of:

A. dithiocarbamate having the general formula:

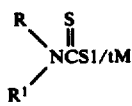

wherein R and R¹ each is a hydrogen atom, an alkyl group, or an aryl group, and R and R¹ may combine to form a 5- or 6-membered ring, and M is a hydrogen atom, a meta ion or group;

B. trithiocarbonate having the general formula:

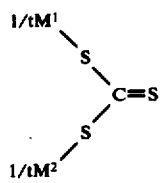

wherein M¹ and M² each is a hydrogen atom, a metal ion or group;

C. dithiophosphate having the general formula:

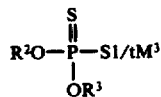

wherein R² and R³ each is a hydrogen atom, an alkyl group or an aryl group, wherein M³ is a hydrogen atom, a metal ion or group;

D. dithioxanthate having the general formula:

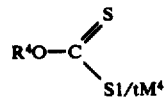

wherein R⁴ is an alkyl group and M⁴ is a hydrogen atom, a metal ion or group; and E. bismuthiol-II;

said metal capable of forming said interreaction product being selected from the group consisting of copper, silver, tin, nickel, cadmium, magnesium, tellurium, gallium, aluminum and gold; in the above formulas (*t*) represents the valency of the metal ion or group.

2. The image-forming process as claimed in claim 1, wherein R¹ is an alkyl group containing 4 or less carbon atoms.

3. The image-forming process as claimed in claim 1, wherein said organic sulfur compound layer has a thickness ranging from about 0.1μ to about 5μ, and said metal layer has a thickness ranging from about 0.1μ to about 5μ.

4. The image-forming process as claimed in claim 1, wherein said multilayer image-forming material comprises a support having thereon said organic sulfur compound layer and said metal layer.

5. The image-forming process as claimed in claim 4, wherein said support is transparent to said electromagnetic radiation.

6. The image-forming process as claimed in claim 4, wherein said organic sulfur compound layer is on said support and said metal layer is on said organic sulfur compound layer.

7. The image-forming process as claimed in claim 4, wherein said metal layer is on said support and said organic compound layer is on said metal layer.

8. The image-forming process as claimed in claim 4, wherein said organic sulfur compound layer comprises said organic sulfur compound in a binder.

9. The image-forming process as claimed in claim 1, wherein said image-forming material contains an optical sensitizer for said organic sulfur compound.

10. The image-forming process as claimed in claim 4, wherein said organic sulfur compound is bismuthiol-II, and said metal layer is silver, aluminum, or copper.

11. The image-forming process as claimed in claim 4, wherein said metal layer is silver or copper and wherein said support is an electrically insulating support.

12. The image-forming process as claimed in claim 4, wherein said metal layer is copper.

13. The image-forming process as claimed in claim 4, wherein said metal layer is aluminum.

14. The image-forming process as claimed in claim 1, wherein after imagewise irradiating with electromagnetic radiation said multilayer image-forming material is subjected to a solvent contact in order to dissolve away the non-irradiated portion of the layer exposed to said electromagnetic radiation.

15. A process for forming an image on a multilayer image-forming material which consists of imagewise irradiating with electromagnetic radiation a multilayer image-forming material which comprises a layer of an organic sulfur compound selected from (1) a dithiocarbamate compound having the general formula

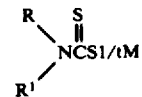

wherein R and R¹ each is a hydrogen atom, an alkyl group or an aryl group, or R and R¹ can combine to form a 5- or 6-membered ring and wherein M is a metal atom, said metal atom being selected from the group consisting of copper, silver, gold, tin, zinc, sodium, iron, selenium and tellurium; (2) a trithiocarbonate compound having the general formula

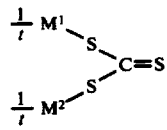

wherein M¹ and M² each is a monovalent metal atom or group, said metal or group being selected from the group consisting of silver, gold, potassium, sodium, ammonium, copper (I), and thallium or a divalent metal atom or group selected from the group consisting of calcium, copper (II), iron, zinc, barium, strontium, titanium, tellurium, arsenic, and selenium; (3) a dithiophosphate having the general formula

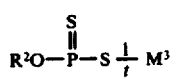

wherein R² and R³ each is a hydrogen atom, an alkyl group or an aryl group and M³ is a metal atom or group, said metal or group being selected from the group consisting of silver, gold, potassium, sodium, ammonium, copper (I), thallium, calcium, copper (II), iron, zinc, $UO_2$, barium, strontium, titanium, and tellurium; (4) dithioxanthate compound having the general formula

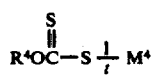

wherein $R^4$ is an alkyl group and $M^4$ is a metal atom or group, said metal or group being selected from the group consisting of silver, gold, potassium, sodium, ammonium, copper, calcium and barium; or (5) bismu-thiol-II, and a layer of a metal capable of forming an interreaction product with said sulfur compound upon irradiation with electromagnetic radiation, said metal being selected from the group consisting of copper, silver, tin, nickel, cadmium, magnesium, tellurium, gallium, aluminum and gold in the above formulas ($t$) represents the valency of the metal ion or group.

16. The image-forming process as claimed in claim 8 wherein R is an alkyl group containing four or less carbon atoms.

* * * * *